United States Patent
Wah et al.

(10) Patent No.: US 7,861,053 B2
(45) Date of Patent: Dec. 28, 2010

(54) SUPPORTING UN-BUFFERED MEMORY MODULES ON A PLATFORM CONFIGURED FOR REGISTERED MEMORY MODULES

(75) Inventors: Kok Lye Wah, Setapak (MY); Sivakumar Murugesu, Selangor (MY); Ooi Ping Chuin, Perlis (MY); Durgesh Srivastava, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 496 days.

(21) Appl. No.: 11/863,838

(22) Filed: Sep. 28, 2007

(65) Prior Publication Data

US 2009/0089480 A1    Apr. 2, 2009

(51) Int. Cl.
*G06F 12/00* (2006.01)
(52) U.S. Cl. .................. 711/167; 711/101
(58) Field of Classification Search .......... 711/167, 711/154, 103, 101
See application file for complete search history.

(56) References Cited

U.S. PATENT DOCUMENTS 7,289,383 B2 * 10/2007 Cornelius ............... 365/226
2006/0039204 A1 * 2/2006 Cornelius ............... 365/189.05
2006/0259666 A1 * 11/2006 Lee ........................ 710/62
2007/0008809 A1 * 1/2007 Kim ........................ 365/233
2008/0065786 A1 * 3/2008 Baska et al. ............. 710/1

OTHER PUBLICATIONS

Intel Corporation, 66/100 MHz PC SDRAM 64-Bit Non-ECC/Parity 144 Pin Unbuffered SO-DIMM Specification, Revision 1.0, Feb. 1999.*
Hewlett-Packard. "Memory technology evolution: an overview of system memory technologies," technology brief, 7th edition. 2003.*

* cited by examiner

*Primary Examiner*—Pierre-Michel Bataille
(74) *Attorney, Agent, or Firm*—Jordan IP Law, PC

(57) ABSTRACT

A RDIMM enabled memory controller may support a UDIMM by way of a register chip and a PLL chip being implemented in operational relationship with a memory slot and a memory controller configured to support a RDIMM. The memory controller may drive address and control signals from the memory controller to the register chip, and the address and control signals may be provided from the register chip to the memory slot after one clock cycle, in response to the register chip latching onto the address and control signals from the memory controller on a rising clock edge.

13 Claims, 2 Drawing Sheets

SUPPORTING UN-BUFFERED MEMORY MODULES ON A PLATFORM CONFIGURED FOR REGISTERED MEMORY MODULES

COPYRIGHT & TRADEMARK NOTICES

A portion of the disclosure of this patent document contains material, which is subject to copyright protection. The owner has no objection to the facsimile reproduction by any one of the patent documents or the patent disclosure, as it appears in the Patent and Trademark Office patent file or records, but otherwise reserves all copyrights whatsoever.

Certain marks referenced herein may be common law or registered trademarks of third parties affiliated or unaffiliated with the applicant or the assignee. Use of these marks is for providing an enabling disclosure by way of example and shall not be construed to limit the scope of this invention to material associated with such marks.

FIELD OF INVENTION

The present invention relates generally to memory controllers and, more particularly, to systems, methods and corresponding products that support memory modules in a computing environment.

BACKGROUND

A dual inline memory module (DIMM) comprises a series of random access memory integrated circuits. These modules are generally mounted on a printed circuit board designed for use in personal computers. Two common types of DIMMs are (1) registered DIMMs (RDIMMs) and (2) un-buffered DIMMs (UDIMMS). A RDIMM is a DIMM that provides register and phase locked loop (PLL) operations on the DIMM itself, while an UDIMM does not provide said operations.

Due to the built-in register in RDIMM, RDIMM-based platforms allow more DIMMs to be installed on the platform. The PLL operation provides for the synchronization and stability of data signals in the processing environment by generating a clock signal that is locked to the phase of a reference signal. As such, it is desirable to use RDIMMs over UDIMMs in enterprise computing environments where more DIMMs on the platforms are required for higher memory capacity. Some computer manufacturers, however, prefer to use UDIMMs due to the lower cost associated with making and using that type of memory.

Certain processing platforms (e.g., Whitmore Lake [Intel 3100] and San Clemente [Intel 5100]), however, include memory controllers that only support RDIMMs. A memory controller is a chip typically included on a computer's motherboard or processor which manages the flow of data between the processor and memory.

Redesigning the memory controller in each platform to support a UDIMM is an expensive proposition and is therefore not a viable option for a low-cost manufacturer that wishes to use UDIMMs in RDIMM-based platforms. For the above reasons, methods and systems are needed that can overcome the mentioned shortcomings.

BRIEF DESCRIPTION OF THE DRAWINGS

Embodiments of the present invention are understood by referring to the figures in the attached drawings, as provided below.

Features, elements and aspects of the invention that are referenced by the same numerals in different figures represent the same, equivalent or similar features, elements or aspects, in accordance with one or more embodiments.

DETAILED DESCRIPTION OF EXEMPLARY EMBODIMENTS

The present invention relates generally to memory controllers in a computing environment and, more particularly, to systems, methods and corresponding products that support dual inline memory modules (DIMMs).

For purposes of summarizing, certain aspects, advantages and novel features of the invention have been described herein. It is to be understood that not all such advantages may be achieved in accordance with any one particular embodiment of the invention. Thus, the invention may be embodied or carried out in a manner that achieves or optimizes one advantage or group of advantages without achieving all advantages as may be taught or suggested herein.

A RDIMM enabled memory controller may support a UDIMM by way of a register chip and a PLL chip being implemented in operational relationship with a memory slot and a memory controller configured to support a RDIMM. The memory controller may drive address and control signals from the memory controller to the register chip, and the address and control signals may be provided from the register chip to the memory slot after one clock cycle, in response to the register chip latching onto the address and control signals from the memory controller on a rising clock edge.

In one embodiment, the PLL chip may receive one clock input from the memory controller and provide one or more clock outputs to a UDIMM, via the memory slot. The PLL chip may further provide one clock output to the register chip to allow the register chip and the UDIMM clock to be synchronized. In one embodiment, the PLL chip provides at least three clock outputs to the UDIMM. The address and control signals are provided from the register chip to the memory slot after one clock signal to mimic a memory access latency associated with that of a RDIMM.

In some embodiments, a reset signal may be de-asserted on the register chip prior to enabling output clock signals from the PLL chip to produce a delay sufficiently long to allow the PLL chip to lock a first frequency. The delay produced from de-asserting the reset signal stabilizes the output clock signals before the output clock signals are propagated from the PLL chip to the memory slot and the register chip.

One or more of the above-disclosed embodiments in addition to certain alternatives are provided in further detail below with reference to the attached figures. The invention is not, however, limited to any particular embodiment disclosed.

In the following, numerous specific details are set forth to provide a thorough description of various embodiments of the invention. Certain embodiments of the invention may be practiced without these specific details or with some variations in detail. In some instances, certain features are described in less detail so as not to obscure other aspects of the invention. The level of detail associated with each of the elements or features should not be construed to qualify the novelty or importance of one feature over the others.

Figure 1:
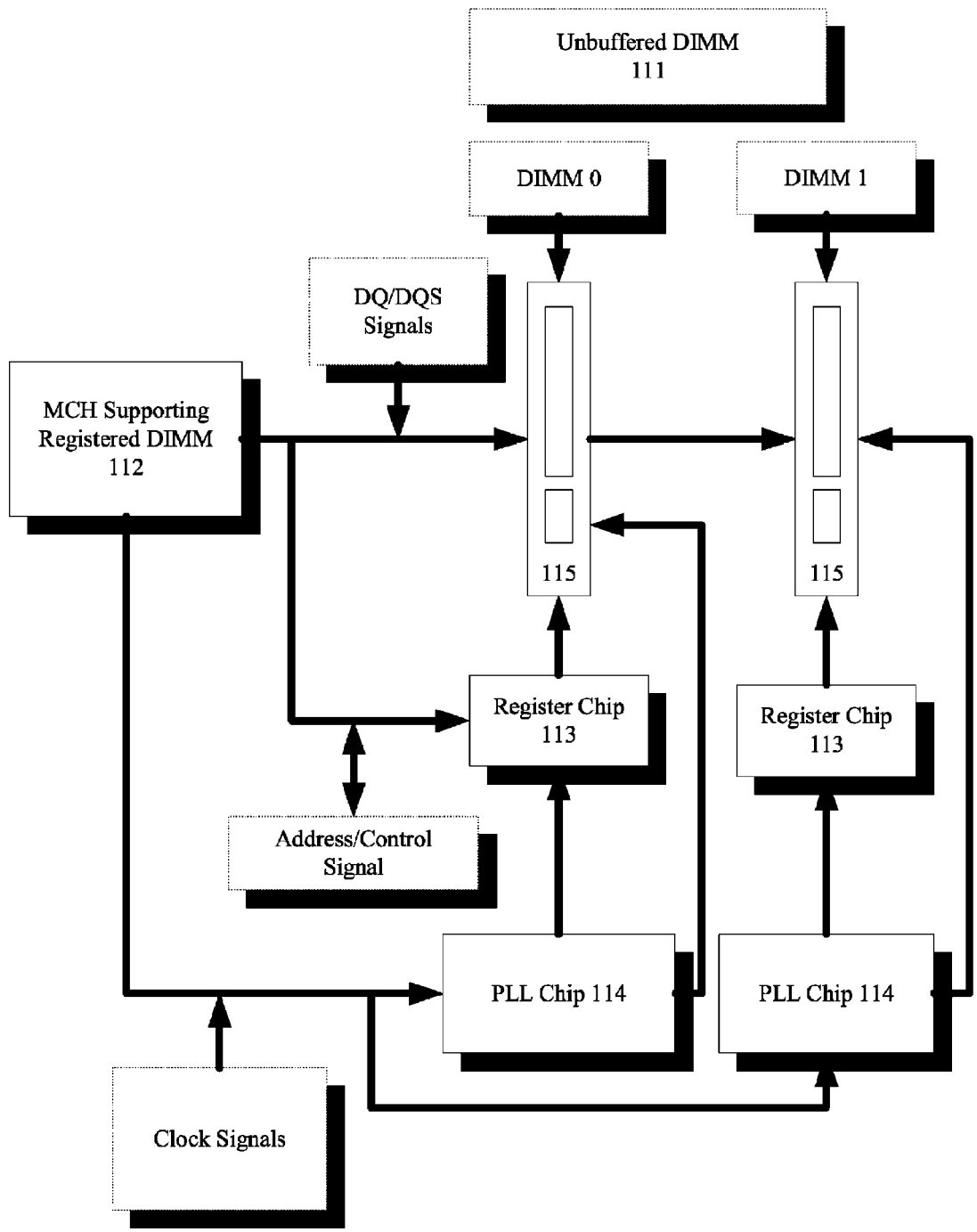
FIG. 1 illustrates a block diagram showing multiple UDIMMs supported by a memory controller, in accordance with one embodiment.

Referring to FIG. 1, a block diagram of an electronic circuit for supporting one or more UDIMMs is provided. In one embodiment, a memory controller on the circuit is initially configured to support RDIMMs only. As shown, memory controller hub (MCH) 112 is in operational relationship with other circuit components to support one or more UDIMMs 111, instead.

In accordance with one embodiment, MCH 112 may be electrically connected to one or more register chips 113, PLL chips 114 and memory slots 115, such that MCH 112 can provide (a) data signals to memory slots 115, (b) address and control signals to register chips 113, and (c) clock signals to PLL chips 114, as provided in more detail below.

Figure 2:
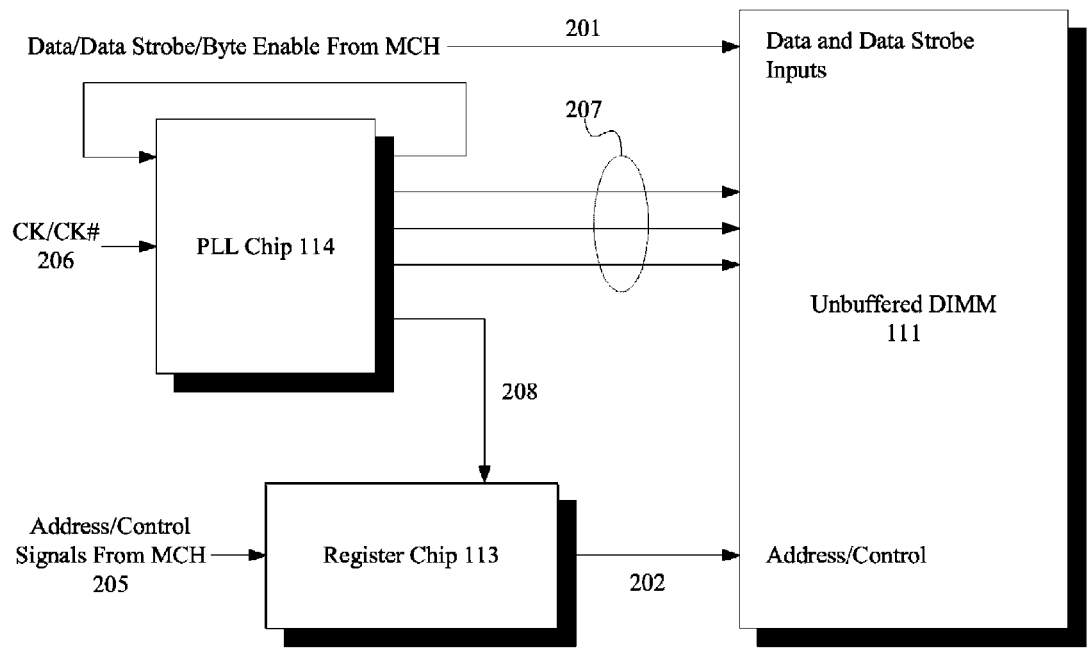
FIG. 2 is a block diagram of the simplified on board register to enable use of a UDIMM in a RDIMM-based platform, in accordance with one embodiment.

Referring to FIGS. 1 and 2, a UDIMM 111 may be coupled to a memory slot 115. Memory slot 115 is connected to a RDIMM-configured MCH 112. In one embodiment, MCH 112 may support a UDIMM 111 by way of implementing an operational relationship with at least one PLL chip 114 and a register chip 113 installed, preferably, on the motherboard on which memory slots 115 reside.

In the exemplary embodiment illustrated in FIG. 2, UDIMM 111 receives five input signals; three signals 207 are provided from a PLL chip 114, a signal 202 is provided from register chip 113, and another signal 201 is provided from MCH 112. As shown, in FIGS. 1 and 2, MCH 112 drives address and control signals 205 to register chip 113. Register chip 113 in turn provides the control and address signals to address/control input of UDIMM 111. MCH 112 also drives clock signal 206 to PLL chip 114, and data signals 201 to data and data strobe inputs of UDIMM 111, for example.

In accordance with one embodiment, PLL chip 114 receives one clock signal 206 from MCH 112, and provides three clock outputs 207 to UDIMM 111 (e.g., via memory slot 115), and one clock signal 208 to the register chip 113, thus allowing register chip 113 and UDIMM 111 to synchronize. In some embodiments, a sufficient delay is implemented to allow PLL chip 114 to lock the intended frequency and stabilize clock signal 206 before the output clock signals 207 and 208 are propagated to UDIMM 111 and register chip 113, respectively.

Register chip 113 may latch onto address/control signals 205 provided by MCH 112 on the rising clock edge and may drive an output address/control signal to UDIMM 111 after one clock cycle. Accordingly, UDIMM 111 in combination with register chip 113 and PLL chip 114 can reproduce a column access strobe (CAS) latency associated with a RDIMM. CAS latency refers to the number of clock pulses that occur between the time instructions given for the RDIMM to output data, until the data is outputted to the IO bus, for example.

In certain embodiments, a reset signal may be de-asserted on register chip 113 prior to the output being enabled on PLL chip 114. The reset signal causes a delay that is sufficient to allow PLL chip 114 to lock the intended frequency and stabilize clock signal 206. Further, in some embodiments, the program code (i.e., BIOS) that is executed during the power up may need to be modified not to generate an error and continue with the startup (i.e., boot) process, when it detects a UDIMM coupled to memory slot 115 on the platform.

The above disclosed embodiments may be applicable to double-data-rate two (DDR2) based RDIMMs, by way of example. It is noteworthy, however, that the scope of the invention should not be construed as limited to such exemplary embodiments. Depending on implementation, the principals and advantages disclosed herein may be applicable to any type of memory. Further, the number of memory chips, register chips, PLL chips and other circuit components disclosed herein is provided by way of example. As such, depending on implementation, different embodiments may include different numbers of associated components.

The foregoing may be utilized to design an integrated circuit chip, in whole or in part. The design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of chip design in question that are to be formed on a wafer. The photolithographic masks are utilized to define areas of the wafer (and/or the layers thereon) to be etched or otherwise processed.

It should be further understood that the logic code, programs, modules and processes disclosed herein and any methods and the order in which the respective steps of each method are performed are purely exemplary. Depending on implementation, the steps may be performed in any order, in series, or in parallel, unless indicated otherwise in present disclosure. Further, the logic code is not related, or limited to any particular programming language, and may comprise of one or more modules that execute on one or more processors in a distributed, non-distributed or multiprocessing environment.

Therefore, it should be understood that the invention can be practiced with modifications and alteration within the spirit and scope of the appended claims. The description is not intended to be exhaustive or to limit the invention to the precise form disclosed. These and various other adaptations and combinations of the embodiments disclosed are within the scope of the invention and are further defined by the claims and their full scope of equivalents.

What is claimed is:

1. A system for configuring a RDIMM enabled memory controller to support a UDIMM, the system comprising:
   a register chip;
   a PLL chip; and
   a memory controller configured to support a RDIMM in operational relationship with a memory slot adapted to receive a UDIMM;
   driving address and control signals from the memory controller to the register chip,
   wherein the memory controller drives the address and control signals from the register chip to the memory slot after one clock cycle, responsive to the register chip latching onto the address and control signals from the memory controller on a rising clock edge.

2. The system of claim 1, wherein the PLL chip receives one clock input from the memory controller and provides one or more clock outputs to a UDIMM, via the memory slot.

3. The system of claim 1, wherein the PLL chip provides one clock output to the register chip to allow the register chip and the UDIMM clock to be synchronized.

4. The system of claim 1, wherein the PLL chips provides at least three clock outputs to the UDIMM.

5. The system of claim 1, wherein driving the address and control signals from the register chip to the memory slot after one clock signal reproduces a memory access latency associated with that of a RDIMM.

6. The system of claim 1, further comprising de-asserting a reset signal on the register chip prior to enabling output clock signals from the PLL chip to produce a delay sufficiently long to allow the PLL chip to lock a first frequency.

7. The system of claim 6, wherein the delay produced from de-asserting the reset signal stabilizes the output clock signals before the output clock signals are propagated from the PLL chip to the memory slot and the register chip.

8. A method for configuring a RDIMM enabled memory controller to support a UDIMM, the method comprising:
   implementing a register chip and a PLL chip in operational relationship with a memory slot and a memory controller configured to support a RDIMM;
   driving address and control signals from the memory controller to the register chip; and
   driving the address and control signals from the register chip to the memory slot after one clock cycle, responsive to the register chip latching onto the address and control signals from the memory controller on a rising clock edge;
   wherein the PLL chip receives one clock input from the memory controller and provides one or more clock outputs to a UDIMM, via the memory slot, and
   wherein the PLL chip provides one clock output to the register chip to allow the register chip and the UDIMM clock to be synchronized.

9. The method of claim 8, wherein the PLL chips provides at least three clock outputs to the UDIMM.

10. The method of claim 8, wherein driving the address and control signals from the register chip to the memory slot after one clock signal reproduces a memory access latency associated with that of a RDIMM.

11. The method of claim 8, further comprising de-asserting a reset signal on the register chip prior to enabling output clock signals from the PLL chip to produce a delay sufficiently long to allow the PLL chip to lock a first frequency.

12. The method of claim 11, wherein the delay produced from de-asserting the reset signal stabilizes the output clock signals before the output clock signals are propagated from the PLL chip to the memory slot and the register chip.

13. The method of claim 10, wherein the latency is a column access strobe latency.

* * * * *